United States Patent
Lin

(10) Patent No.: US 12,130,592 B2
(45) Date of Patent: Oct. 29, 2024

(54) TIME-TO-DIGITAL CONVERTER APPARATUS AND CONVERTING METHOD THEREOF

(71) Applicant: NANYA TECHNOLOGY CORPORATION, New Taipei (TW)

(72) Inventor: Heng Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 179 days.

(21) Appl. No.: 18/152,747

(22) Filed: Jan. 10, 2023

(65) Prior Publication Data
US 2024/0231281 A1    Jul. 11, 2024

(51) Int. Cl.
| G04F 10/00 | (2006.01) |
| H03L 7/099 | (2006.01) |
| H03M 7/30 | (2006.01) |
| H04L 27/227 | (2006.01) |

(52) U.S. Cl.
CPC ............ *G04F 10/005* (2013.01); *G04F 10/00* (2013.01); *H03L 7/099* (2013.01); *H03M 7/3084* (2013.01); *H04L 27/2272* (2013.01)

(58) Field of Classification Search
CPC .... H03M 7/3084; G04F 10/005; G04F 10/00; H04L 27/2272; H03L 7/099
See application file for complete search history.

(56) References Cited

U.S. PATENT DOCUMENTS

| 2018/0299835 A1* | 10/2018 | Testi ...................... G04F 10/005 |
| 2020/0310359 A1 | 10/2020 | Yuan et al. |
| 2021/0336624 A1 | 10/2021 | Kong et al. |

FOREIGN PATENT DOCUMENTS

| TW | 200935071 | 8/2009 |
| WO | 2021028156 | 2/2021 |
| WO | 2021243451 | 12/2021 |

OTHER PUBLICATIONS

"Notice of allowance of Taiwan Counterpart Application", issued on Sep. 19, 2023, p. 1-p. 3.

* cited by examiner

*Primary Examiner* — Joseph J Lauture
(74) *Attorney, Agent, or Firm* — JCIPRNET

(57) ABSTRACT

A time-to-digital converter apparatus and a converting method thereof are provided. An output signal of a first ring oscillator circuit is counted to generate a first digital code. An output signal of a second ring oscillator circuit is counted to generate a second digital code. A corresponding third digital code is generated according to a time point of phase coincidence between one of outputs of a plurality of first delay stages of the first ring oscillator circuit and one of outputs of a plurality of second delay stages of the second ring oscillator circuit.

12 Claims, 4 Drawing Sheets

TIME-TO-DIGITAL CONVERTER APPARATUS AND CONVERTING METHOD THEREOF

BACKGROUND

Technical Field

The disclosure relates to a converter apparatus. In particular, the disclosure relates to a time-to-digital converter apparatus and a converting method thereof.

Description of Related Art

With the development of integrated circuits, relatively broad applications may be realized by converting sensing information obtained by a sensor into the form of a digital code. For a time measurement system, a time-to-digital converter may be used to measure a time interval between two events and convert this time information into a digital signal.

In several current applications (e.g., radar ranging, time of flight, etc.), to meet the accuracy in time measurement, requirements for measurement resolution of the time-to-digital converter are increasing over time. Therefore, how to improve the measurement resolution of the time-to-digital converter is an important issue.

SUMMARY

The disclosure provides a time-to-digital converter apparatus and a converting method thereof, which may provide high-resolution time measurement.

The time-to-digital converter apparatus of the disclosure may convert a time difference between a start signal and a stop signal being received into a digital code signal. The time-to-digital converter apparatus includes a first ring oscillator circuit, a first counter circuit, a second ring oscillator circuit, a second counter circuit, an arbiter circuit, and a coding circuit. The first ring oscillator circuit receives the start signal. The first ring oscillator circuit includes N first delay stages, where N is an odd number greater than 1. The first counter circuit is coupled with the first ring oscillator circuit, counts an output signal of the first ring oscillator circuit to generate a first digital code, and stops counting the output signal of the first ring oscillator circuit according to the stop signal. The second ring oscillator circuit receives the stop signal. The second ring oscillator circuit includes N second delay stages. The second counter circuit is coupled with the second ring oscillator circuit, and counts an output signal of the second ring oscillator circuit to generate a second digital code. The arbiter circuit is coupled with the first ring oscillator circuit and the second ring oscillator circuit, and generates a plurality of arbitration signals according to an output of each of the first delay stages and an output of each of the second delay stages. The arbitration signals indicate a transition state of each of the outputs of the first delay stages and the outputs of the second delay stages. The coding circuit is coupled with the arbiter circuit and the second counter circuit, and outputs a counting stop signal and a third digital code according to the arbitration signals. The counting stop signal is used to control the second counter circuit to stop counting. The third digital code indicates a time point of phase coincidence between one of the outputs of the first delay stages and one of the outputs of the second delay stages.

In an embodiment of the disclosure, the first ring oscillator circuit includes a NAND gate and N−1 inverters. One input terminal of the NAND gate receives the start signal, and another input terminal of the NAND gate is coupled with an output terminal of the first ring oscillator circuit. The N−1 inverters are connected in series between an output terminal of the NAND gate and the another input terminal of the NAND gate. The output terminal of the NAND gate and an output terminal of each of the inverters are coupled with the arbiter circuit.

In an embodiment of the disclosure, the second ring oscillator circuit includes a NAND gate and N−1 inverters. One input terminal of the NAND gate receives the stop signal, and another input terminal of the NAND gate is coupled with an output terminal of the second ring oscillator circuit. The N−1 inverters are connected in series between an output terminal of the NAND gate and the another input terminal of the NAND gate. The output terminal of the NAND gate and an output terminal of each of the inverters are coupled with the arbiter circuit.

In an embodiment of the disclosure, each of the first delay stages has a first delay time, and each of the second delay stages has a second delay time, where the first delay time is greater than the second delay time.

In an embodiment of the disclosure, the coding circuit outputs the counting stop signal and the third digital code when the arbitration signals indicate phase coincidence between one of the outputs of the N first delay stages and one of the outputs of the N second delay stages.

In an embodiment of the disclosure, the arbiter circuit includes a plurality of arbiters. Each of the arbiters is coupled between an output terminal of a corresponding first delay stage and an output terminal of a corresponding second delay stage, and generates a corresponding arbitration signal according to an output of the corresponding first delay stage and an output of the corresponding second delay stage.

In an embodiment of the disclosure, the time-to-digital converter apparatus further includes a register circuit. The register circuit is coupled with the first counter circuit, the second counter circuit, and the coding circuit. The register circuit outputs the first digital code, the second digital code, and the third digital code as the digital code signal according to a clock signal.

The disclosure further provides a converting method of a time-to-digital converter apparatus. The time-to-digital converter apparatus may convert a time difference between a start signal and a stop signal being received into a digital code signal. The time-to-digital converter apparatus includes a first ring oscillator circuit receiving the start signal and a second ring oscillator circuit receiving the stop signal. The first ring oscillator circuit includes N first delay stages, and the second ring oscillator circuit comprises N second delay stages, where N is an odd number greater than 1. The converting method includes the following. An output signal of the first ring oscillator circuit is counted to generate a first digital code. Counting the output signal of the first ring oscillator circuit is stopped according to the stop signal. An output signal of the second ring oscillator circuit is counted to generate a second digital code. A plurality of arbitration signals are generated according to an output of each of the first delay stages and an output of each of the second delay stages. The arbitration signals indicate a transition state of each of the outputs of the first delay stages and the outputs of the second delay stages. A counting stop signal and a third digital code are output according to the arbitration signals. The counting stop signal is used to indicate to stop counting the output signal of the second ring oscillator circuit. The third digital code indicates a time point of phase coincidence between one of the outputs of the first delay stages and one of the outputs of the second delay stages. A digital code signal is generated according to the first digital code, the second digital code, and the third digital code.

In an embodiment of the disclosure, the first ring oscillator circuit includes a NAND gate and N−1 inverters. One input terminal of the NAND gate receives the start signal, and another input terminal of the NAND gate is coupled with an output terminal of the first ring oscillator circuit. The N−1 inverters are connected in series between an output terminal of the NAND gate and the another input terminal of the NAND gate.

In an embodiment of the disclosure, the second ring oscillator circuit includes a NAND gate and N−1 inverters. One input terminal of the NAND gate receives the stop signal, and another input terminal of the NAND gate is coupled with an output terminal of the second ring oscillator circuit. The N−1 inverters are connected in series between an output terminal of the NAND gate and the another input terminal of the NAND gate.

In an embodiment of the disclosure, each of the first delay stages has a first delay time, and each of the second delay stages has a second delay time, where the first delay time is greater than the second delay time.

In an embodiment of the disclosure, The converting method includes the following. The counting stop signal and the third digital code are output when the arbitration signals indicate phase coincidence between one of the outputs of the N first delay stages and one of the outputs of the N second delay stages.

Based on the foregoing, in the embodiment of the disclosure, the output signal of the first ring oscillator circuit is counted to generate the first digital code, the output signal of the second ring oscillator circuit is counted to generate the second digital code, and the corresponding third digital code is generated according to the time point of phase coincidence between one of the outputs of the first delay stages of the first ring oscillator circuit and one of the outputs of the second delay stages of the second ring oscillator circuit. In this way, high-resolution time measurement may be provided by converting the time difference between the start signal and the stop signal into the digital code signal including the first digital code, the second digital code, and the third digital code.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
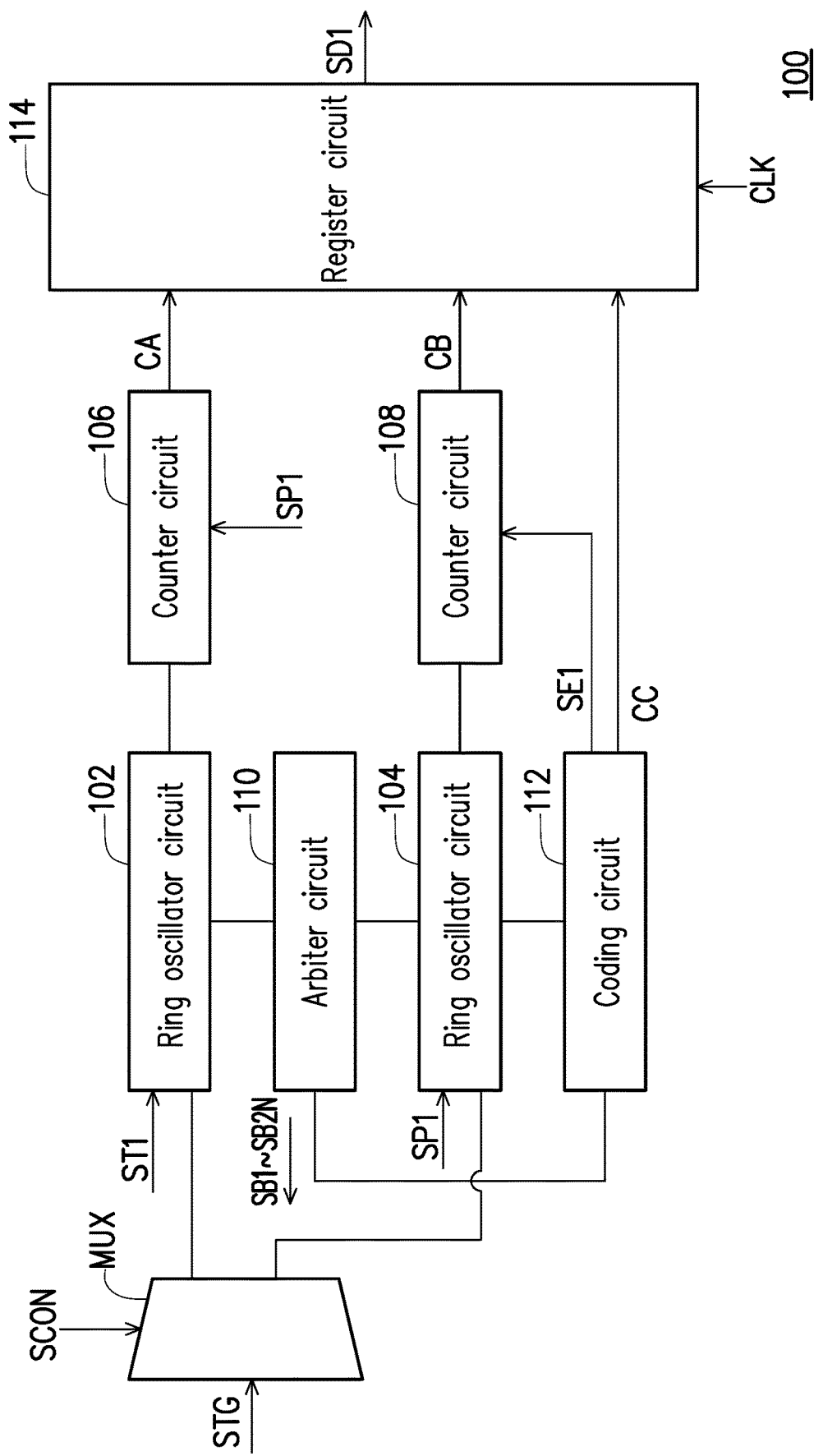
FIG. 1 is a schematic diagram of a time-to-digital converter apparatus according to an embodiment of the disclosure.

FIG. 1 is a schematic diagram of a time-to-digital converter apparatus according to an embodiment of the disclosure. With reference to FIG. 1, a time-to-digital converter apparatus 100 may convert a time difference between a start signal ST1 and a stop signal SP1 that are received into a digital code signal SD1. The time-to-digital converter apparatus 100 may include ring oscillator circuits 102 and 104, counter circuits 106 and 108, an arbiter circuit 110, a coding circuit 112, and a register circuit 114. The arbiter circuit 110 is coupled with the ring oscillator circuits 102 and 104 and the coding circuit 112. The counter circuit 106 is coupled with the ring oscillator circuit 102 and the register circuit 114. The counter circuit 108 is coupled with the ring oscillator circuit 104, the coding circuit 112, and the register circuit 114. The register circuit 114 is further coupled with the coding circuit 112. The start signal ST1 and the stop signal SP1 may come from a multiplexer MUX, for example. An input terminal of the multiplexer MUX is used to receive a target signal STG as the measurement object. The multiplexer MUX may be controlled by a selection signal SCON and transmit the target signal STG as the start signal ST1 to the ring oscillator circuit 102, or transmit the target signal STG as the stop signal SP1 to the ring oscillator circuit 104.

Further, the ring oscillator circuits 102 and 104 may each include N delay stages (not shown), where N is an odd number greater than 1. The counter circuits 106 and 108 are respectively used to count clock signals output by the ring oscillator circuits 102 and 104, and respectively generate a first digital code CA and a second digital code CB. The counter circuit 106 further receives the stop signal SP1. When the counter circuit 106 receives the stop signal SP1 provided by the multiplexer MUX, the counter circuit 106 stops counting. The arbiter circuit 110 may generate a plurality of arbitration signals SB1 to SB2N according to an output of each delay stage in the ring oscillator circuit 102 and an output of each delay stage in the ring oscillator circuit 104. The arbitration signals SB1 to SB2N each indicate a transition state of an output of a corresponding delay stage, for example, transition from a low voltage level to a high voltage level, or transition from a high voltage level to a low voltage level. The coding circuit 112 may output a counting stop signal SE1 and a third digital code CC according to the arbitration signals SB1 to SB2N. Further, the coding circuit 112 may determine a time point of phase coincidence between one of the outputs of the delay stages in the ring oscillator circuit 102 and one of the outputs of the delay stages in the ring oscillator circuit 104 and output the corresponding third digital code CC according to the arbitration signals SB1 to SB2N, and output the counting stop signal SE1 to the counter circuit 108 to control the counter circuit 108 to stop counting.

The register circuit 114 may temporarily store the first digital code CA and the second digital code CB corresponding to the times when the counter circuits 106 and 108 stop counting and the third digital code CC provided by the coding circuit 112. Moreover, the register circuit 114 may be controlled by the clock signal to output the first digital code CA, the second digital code CB, and the third digital code CC as the digital code signal SD1 to the rear-stage processing circuit. The processing circuit may calculate the time difference between the start signal ST1 and the stop signal SP1 according to the first digital code CA, the second digital code CB, and the third digital code CC. For example, a time difference T may between the start signal ST1 and the stop signal SP1 may be calculated by the following formula.

$$T = 2*N*t1*CA + (2*N*CB + CC)*(t1 - t2) \qquad (1)$$

N is the number of delay stages respectively included in the ring oscillator circuits 102 and 104, t1 is a delay time of the delay stage of the ring oscillator circuit 102, and t2 is a delay time of the delay stage of the ring oscillator circuit 104, where the delay time t1 is greater than the delay time t2. It is worth noting that the values of the delay times t1 and t2 may differ from expectations due to factors in the process. In the case where the actual values of the delay times t1 and t2 are uncertain, two sets of the start signal ST1 and the stop signal SP1 that are known to have different time differences may be provided to the ring oscillator circuits 102 and 104 to obtain two corresponding sets of the first digital code CA, the second digital code CB, and the third digital code CC; and the two known sets of the first digital code CA, the second digital code CB, and the third digital code CC may be substituted into formula (1) to obtain the accurate delay times t1 and t2. After the accurate delay times t1 and t2 are obtained, the start signal ST1 and the stop signal SP1 with an unknown time difference may be accurately measured.

Figure 2:
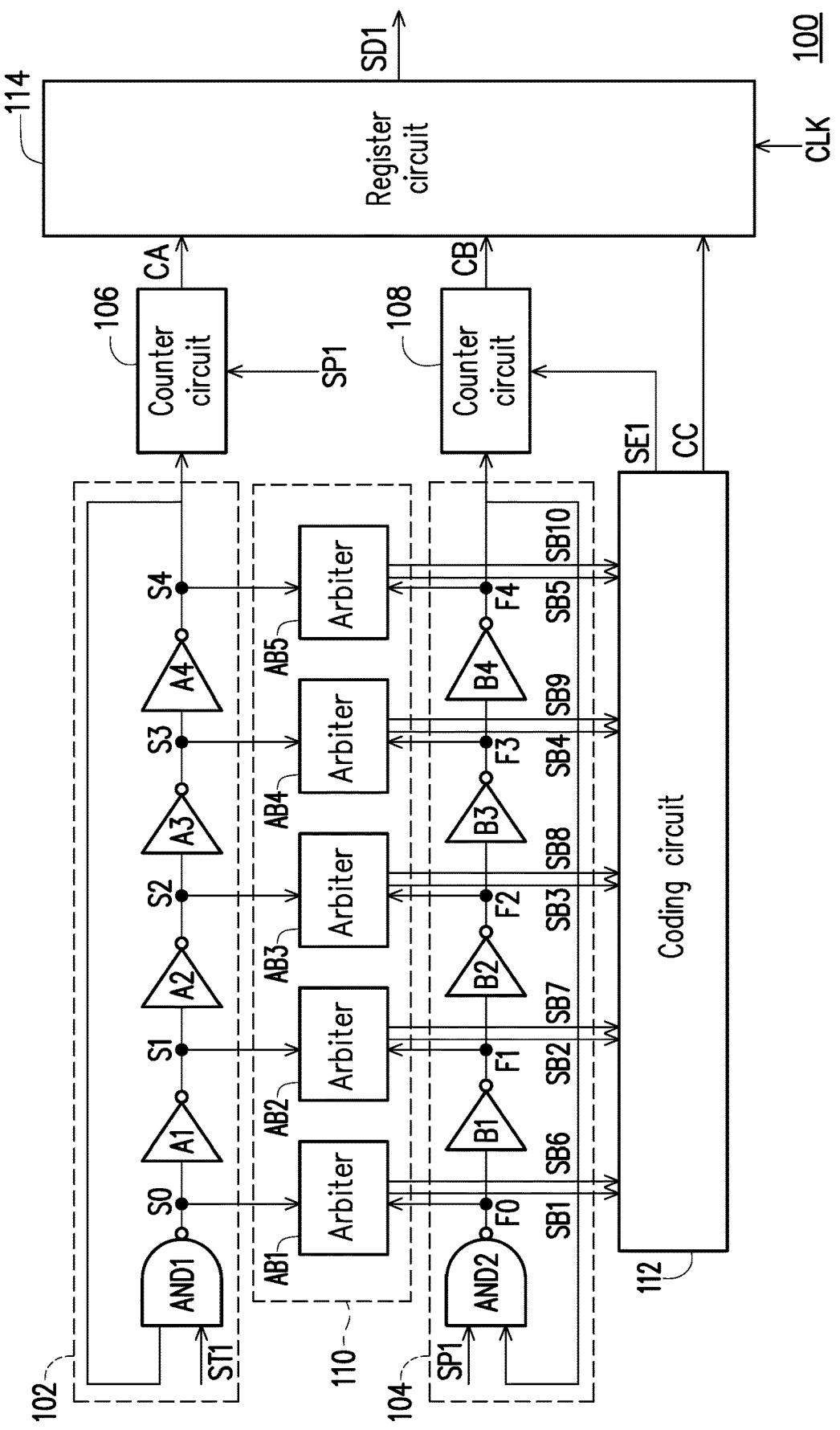
FIG. 2 is a schematic diagram of a time-to-digital converter apparatus according to another embodiment of the disclosure.

FIG. 2 is a schematic diagram of a time-to-digital converter apparatus according to another embodiment of the disclosure. With reference to FIG. 2, in the embodiment of FIG. 2, the ring oscillator circuits 102 and 104 of the time-to-digital converter apparatus 100 each include five delay stages. The five delay stages of the ring oscillator circuit 102 are implemented by a NAND gate AND1 and inverters A1 to A4, and the five delay stages of the ring oscillator circuit 104 are implemented by a NAND gate AND2 and inverters B1 to B4. In the ring oscillator circuit 102, the NAND gate AND1 and the inverters A1 to A4 are sequentially connected in series between an input terminal and an output terminal of the ring oscillator circuit 102. One input terminal of the NAND gate AND1 is used to receive the start signal ST1, and another input terminal is coupled to an output terminal of the inverter A4. Similarly, in the ring oscillator circuit 104, the NAND gate AND2 and the inverters B1 to B4 are sequentially connected in series between an input terminal and an output terminal of the ring oscillator circuit 104. One input terminal of the NAND gate AND2 is used to receive the stop signal SP1, and another input terminal is coupled to an output terminal of the inverter B4.

Figure 3:
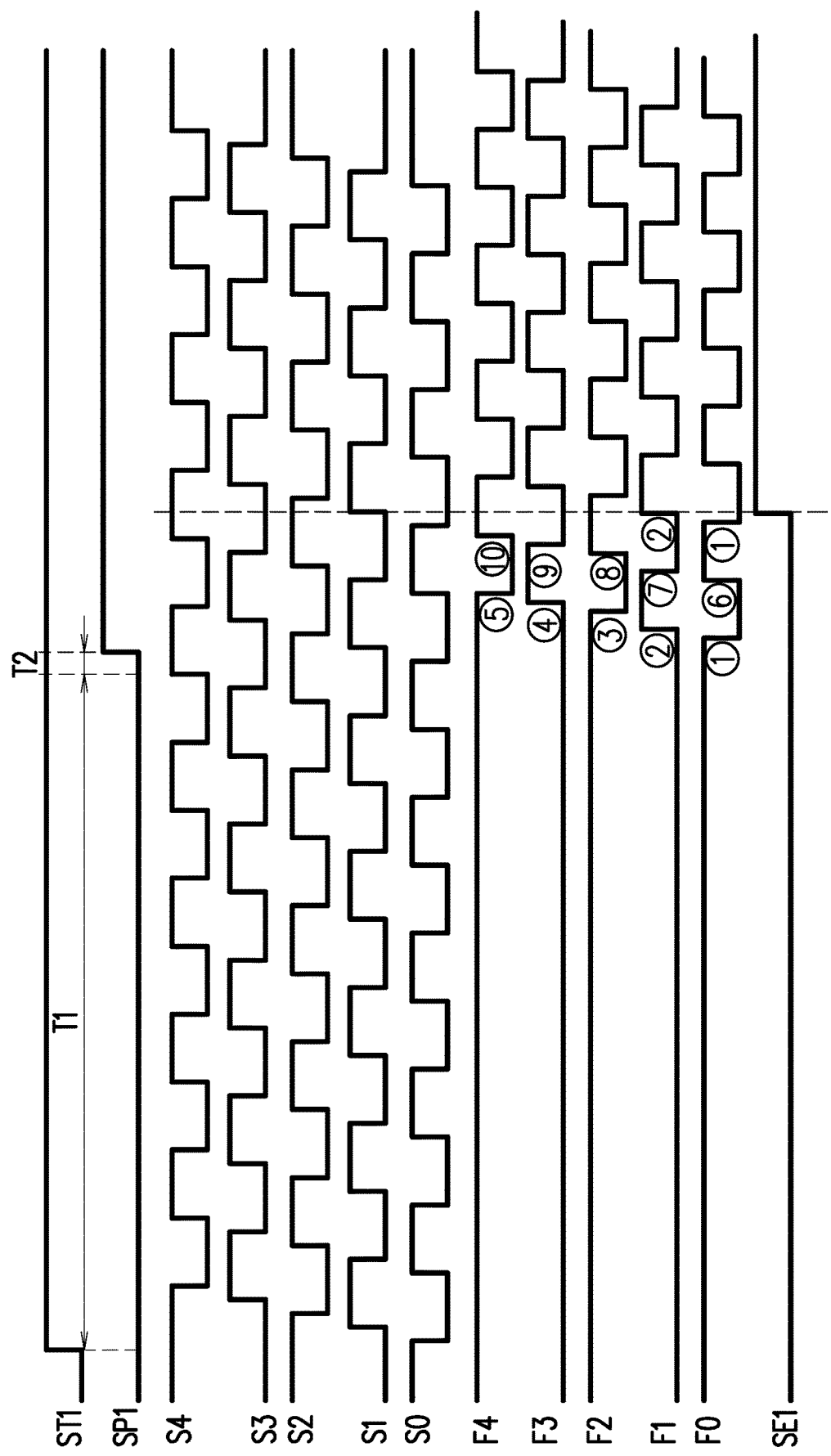
FIG. 3 is a schematic diagram of operation timings of a time-to-digital converter apparatus according to an embodiment of the disclosure.

In addition, in the embodiment of FIG. 2, the arbiter circuit 110 includes five arbiters AB1 to AB5, and each arbiter AB1 to AB5 may include two phase detectors detecting a rising edge and a falling edge. The arbiter AB1 to AB5 are coupled with output terminals of the corresponding delay stages, for example, the arbiter AB1 is coupled with output terminals of the NAND gates AND1 and AND2, the arbiter AB2 is coupled with output terminals of the inverters A1 and B1, and so on. In addition, the arbiters AB1 to AB5 are further coupled with the coding circuit 112. According to output signals S0 to S4 and output signals F0 to F4, the arbiters AB1 to AB5 may determine a transition state of each of outputs of the NAND gates AND1 and AND2 and outputs of the inverters A1 to A4 and B1 to B4, and output a corresponding arbitration signal. For example, as shown in FIG. 3, the arbiters AB1 to AB5 may respectively output the arbitration signals SB1 to SB10 at transition time points ① to ⑩ of the output signals F0 to F4. For example, when the output signal F0 transitions from a high voltage level to a low voltage level, the arbiter AB1 may output the arbitration signal SB1 with a bit value of "0" if the phases of the output signal F0 and the corresponding output signal S0 do not coincide, or may output the arbitration signal SB1 with a bit value of "1" in the opposite case. For another example, when the output signal F1 transitions from a low voltage level to a high voltage level, the arbiter AB2 may output the arbitration signal SB2 with a bit value of "0" if the phases of the output signal F1 and the corresponding output signal S1 do not coincide, or may output the arbitration signal SB2 with a bit value of "1" in the opposite case. By analogy, when the output signals F2 to F4 transitions, the arbiters AB3 to AB5 may also respectively determine whether the phases of the output signals S2 to S4 and the corresponding output signals F2 to F4 coincide, and output the arbitration signals according to the determination results. According to the bit values of the arbitration signals SB1 to SB10 output by the arbiters AB1 to AB5, the coding circuit 112 may generate the third digital code CC, and may generate the counting stop signal SE1 to the counter circuit 108.

For example, in the embodiment of FIG. 3, when the output signal F1 of the inverter B1 of the ring oscillator circuit 104 transitions from a low voltage level to a high voltage level at the transition time point ②, the output signal S1 of the inverter A1 of the ring oscillator circuit 102 also transitions from a low voltage level to a high voltage level at the same time. In other words, the phases of the output signal F1 and the output signal S1 coincide. At this time, the bit value of the arbitration signal SB2 corresponding to the transition time point ② is "1", and the bit values of the rest arbitration signals SB1 and SB3 to SB10 are "0". According to the arbitration signals SB1 to SB10 output by the arbiters AB1 to AB5, the coding circuit 112 may generate the third digital code CC, and generate the counting stop signal SE1 for the counter circuit 108. The register circuit 114 may be controlled by a clock signal CLK to output the first digital code CA corresponding to the time when the counter circuit 106 stops counting, the second digital code CB corresponding to the time when the counter circuit 108 stops counting, and the third digital code CC as the digital code signal SD1 to the rear-stage processing circuit. The processing circuit may calculate the time difference between the start signal ST1 and the stop signal SP1 according to formula (1) above. The time difference between the start signal ST1 and the stop signal SP1 may be equal to time T1+T2 as shown in FIG. 3, where time T1 is equal to 2*5*t1*CA, and time T2 is equal to (2*5*CB+CC)*(t1−t2). In this embodiment, the value of the first digital code CA is 5 (the counter circuit 106 counts to 5 rising edges of the output signal S4), the value of the second digital code CB is 1 (the counter circuit 108 counts to 1 rising edge of the output signal F4), and the value of the third digital code CC is 2 (the position of phase coincidence between the output signals is at the transition time point ②).

Figure 4:
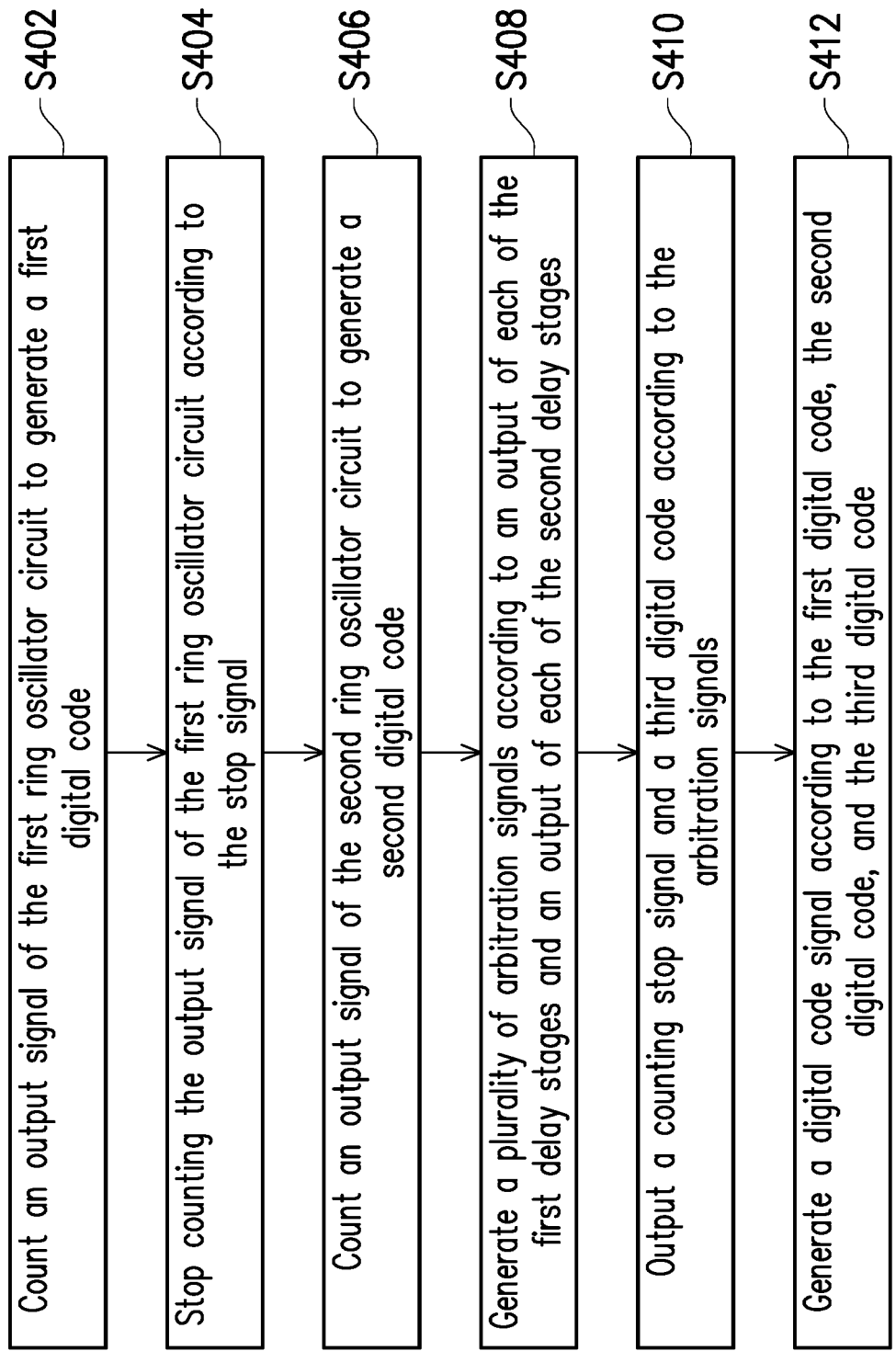
FIG. 4 is a flowchart of a converting method of a time-to-digital converter apparatus according to an embodiment of the disclosure.

FIG. 4 is a flowchart of a converting method of a time-to-digital converter apparatus according to an embodiment of the disclosure. The time-to-digital converter apparatus may convert a time difference between a start signal and a stop signal that are received into a digital code signal. The time-to-digital converter apparatus includes a first ring oscillator circuit receiving the start signal and a second ring oscillator circuit receiving the stop signal. The first ring oscillator circuit includes N first delay stages, and the second ring oscillator circuit includes N second delay stages, where N is an odd number greater than 1. Each first delay stage has a first delay time, and each second delay stage has a second delay time, where the first delay time is greater than the second delay time. Further, the first ring oscillator circuit may include an NAND gate and N−1 inverters as the N first delay stages. A first input terminal of the NAND gate receives the start signal, and a second input terminal of the NAND gate is coupled with an output terminal of the first ring oscillator circuit. The N−1 inverters are connected in series between an output terminal of the NAND gate and the second input terminal of the NAND gate. In addition, the second ring oscillator circuit may also include an NAND gate and N−1 inverters as the N second delay stages. A first input terminal of the NAND gate receives the stop signal, and a second input terminal of the NAND gate is coupled with an output terminal of the second ring oscillator circuit. The N−1 inverters are connected in series between an output terminal of the NAND gate and the second input terminal of the NAND gate.

As can be known from the embodiments above, the converting method of a time-to-digital converter apparatus may include at least the following steps. First, an output signal of the first ring oscillator circuit is counted to generate a first digital code (step S402). Then, counting the output signal of the first ring oscillator circuit is stopped according to the stop signal (step S404). Also, an output signal of the second ring oscillator circuit is counted to generate a second digital code (step S406). Then, a plurality of arbitration signals are generated according to an output of each of the first delay stages and an output of each of the second delay stages (step S408). The arbitration signals indicate a transition state of each of the outputs of the first delay stages and the outputs of the second delay stages, for example, indicate whether rising edges or falling edges appear at the same time. After that, a counting stop signal and a third digital code are output according to the arbitration signals (step S410). For example, the counting stop signal and the third digital code are output when the arbitration signals indicate phase coincidence between one of the outputs of the N first delay stages and one of the outputs of the N second delay stages. The counting stop signal is used to indicate to stop counting the output signal of the second ring oscillator circuit, and the third digital code indicates a time point of phase coincidence between one of the outputs of the first delay stages and one of the outputs of the second delay stages. Lastly, a digital code signal is generated according to the first digital code, the second digital code, and the third digital code (step S412). The time difference between the start signal and the stop signal can be accurately calculated using the first digital code, the second digital code, the third digital code in the digital code signal and formula (1) above.

In summary of the foregoing, in the embodiment of the disclosure, the output signal of the first ring oscillator circuit is counted to generate the first digital code, the output signal of the second ring oscillator circuit is counted to generate the second digital code, and the corresponding third digital code is generated according to the time point of phase coincidence between one of the outputs of the first delay stages of the first ring oscillator circuit and one of the outputs of the second delay stages of the second ring oscillator circuit. In this way, high-resolution time measurement may be provided by converting the time difference between the start signal and the stop signal into the digital code signal including the first digital code, the second digital code, and the third digital code.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A time-to-digital converter apparatus converting a time difference between a start signal and a stop signal being received into a digital code signal, the time-to-digital converter apparatus comprising:
   a first ring oscillator circuit receiving the start signal, the first ring oscillator circuit comprising N first delay stages, where N is an odd number greater than 1;
   a first counter circuit coupled with the first ring oscillator circuit, counting an output signal of the first ring oscillator circuit to generate a first digital code, and stopping counting the output signal of the first ring oscillator circuit according to the stop signal;
   a second ring oscillator circuit receiving the stop signal, the second ring oscillator circuit comprising N second delay stages;
   a second counter circuit coupled with the second ring oscillator circuit, and counting an output signal of the second ring oscillator circuit to generate a second digital code;
   an arbiter circuit coupled with the first ring oscillator circuit and the second ring oscillator circuit, and generating a plurality of arbitration signals according to an output of each of the first delay stages and an output of each of the second delay stages, wherein the arbitration signals indicate a transition state of each of the outputs of the first delay stages and the outputs of the second delay stages; and
   a coding circuit coupled with the arbiter circuit and the second counter circuit, and outputting a counting stop signal and a third digital code according to the arbitration signals, wherein the counting stop signal is used to control the second counter circuit to stop counting, and the third digital code indicates a time point of phase coincidence between one of the outputs of the first delay stages and one of the outputs of the second delay stages.

2. The time-to-digital converter apparatus according to claim 1, wherein the first ring oscillator circuit comprises:
   a NAND gate, wherein one input terminal of the NAND gate receives the start signal, and another input terminal of the NAND gate is coupled with an output terminal of the first ring oscillator circuit; and
   N−1 inverters connected in series between an output terminal of the NAND gate and the another input terminal of the NAND gate, wherein the output terminal of the NAND gate and an output terminal of each of the inverters are coupled with the arbiter circuit.

3. The time-to-digital converter apparatus according to claim 1, wherein the second ring oscillator circuit comprises:
   a NAND gate, wherein one input terminal of the NAND gate receives the stop signal, and another input terminal of the NAND gate is coupled with an output terminal of the second ring oscillator circuit; and
   N−1 inverters connected in series between an output terminal of the NAND gate and the another input terminal of the NAND gate, wherein the output terminal of the NAND gate and an output terminal of each of the inverters are coupled with the arbiter circuit.

4. The time-to-digital converter apparatus according to claim 1, wherein each of the first delay stages has a first delay time, and each of the second delay stages has a second delay time, where the first delay time is greater than the second delay time.

5. The time-to-digital converter apparatus according to claim 1, wherein the coding circuit outputs the counting stop signal and the third digital code when the arbitration signals indicate phase coincidence between one of the outputs of the N first delay stages and one of the outputs of the N second delay stages.

6. The time-to-digital converter apparatus according to claim 1, wherein the arbiter circuit comprises a plurality of arbiters, wherein each of the arbiters is coupled between an output terminal of a corresponding first delay stage and an output terminal of a corresponding second delay stage, and generates a corresponding arbitration signal according to an output of the corresponding first delay stage and an output of the corresponding second delay stage.

7. The time-to-digital converter apparatus according to claim 1, further comprising:
    a register circuit coupled with the first counter circuit, the second counter circuit, and the coding circuit, and outputting the first digital code, the second digital code, and the third digital code as the digital code signal according to a clock signal.

8. A converting method of a time-to-digital converter apparatus, the time-to-digital converter apparatus converting a time difference between a start signal and a stop signal being received into a digital code signal, the time-to-digital converter apparatus comprising a first ring oscillator circuit receiving the start signal and a second ring oscillator circuit receiving the stop signal, wherein the first ring oscillator circuit comprises N first delay stages, and the second ring oscillator circuit comprises N second delay stages, where N is an odd number greater than 1, the converting method comprising:
    counting an output signal of the first ring oscillator circuit to generate a first digital code;
    stopping counting the output signal of the first ring oscillator circuit according to the stop signal;
    counting an output signal of the second ring oscillator circuit to generate a second digital code;
    generating a plurality of arbitration signals according to an output of each of the first delay stages and an output of each of the second delay stages, wherein the arbitration signals indicate a transition state of each of the outputs of the first delay stages and the outputs of the second delay stages;
    outputting a counting stop signal and a third digital code according to the arbitration signals, wherein the counting stop signal is used to indicate to stop counting the output signal of the second ring oscillator circuit, and the third digital code indicates a time point of phase coincidence between one of the outputs of the first delay stages and one of the outputs of the second delay stages; and
    generating a digital code signal according to the first digital code, the second digital code, and the third digital code.

9. The converting method according to claim 8, wherein the first ring oscillator circuit comprises:
    a NAND gate, wherein one input terminal of the NAND gate receives the start signal, and another input terminal of the NAND gate is coupled with an output terminal of the first ring oscillator circuit; and
    N−1 inverters connected in series between an output terminal of the NAND gate and the another input terminal of the NAND gate.

10. The converting method according to claim 8, wherein the second ring oscillator circuit comprises:
    a NAND gate, wherein one input terminal of the NAND gate receives the stop signal, and another input terminal of the NAND gate is coupled with an output terminal of the second ring oscillator circuit; and
    N−1 inverters connected in series between an output terminal of the NAND gate and the another input terminal of the NAND gate.

11. The converting method according to claim 8, wherein each of the first delay stages has a first delay time, and each of the second delay stages has a second delay time, where the first delay time is greater than the second delay time.

12. The converting method according to claim 8, comprising:
    outputting the counting stop signal and the third digital code when the arbitration signals indicate phase coincidence between one of the outputs of the N first delay stages and one of the outputs of the N second delay stages.

* * * * *